United States Patent
Ranade et al.

(10) Patent No.: US 6,809,005 B2
(45) Date of Patent: Oct. 26, 2004

(54) METHOD TO FILL DEEP TRENCH STRUCTURES WITH VOID-FREE POLYSILICON OR SILICON

(75) Inventors: Rajiv Ranade, Beacon, NY (US); Gangadhara S. Mathad, Poughkeepsie, NY (US); Kevin K. Chan, Staten Island, NY (US); Subhash B. Kulkarni, Cortlandt Manor, NY (US)

(73) Assignees: Infineon Technologies AG (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/386,880

(22) Filed: Mar. 12, 2003

(65) Prior Publication Data

US 2004/0180510 A1 Sep. 16, 2004

(51) Int. Cl.$^7$ ................................................ H01L 21/76
(52) U.S. Cl. ........................ 438/426; 438/388; 438/422
(58) Field of Search ................................. 438/243–249, 438/386–392, 421–429, 430, 446; 257/300, 301

(56) References Cited

U.S. PATENT DOCUMENTS

| 5,234,856 A | * | 8/1993 | Gonzalez .................... 438/244 |
| 6,083,828 A | * | 7/2000 | Lin et al. .................... 438/639 |
| 6,677,197 B2 | * | 1/2004 | Kudelka et al. ............ 438/245 |
| 2001/0001175 A1 | | 5/2001 | Narwankar et al. |
| 2001/0021592 A1 | | 9/2001 | Lee et al. |

* cited by examiner

*Primary Examiner*—Matthew Smith
*Assistant Examiner*—Calvin Lee
(74) *Attorney, Agent, or Firm*—Lerner, David, Littenberg, Krumholz & Mentlik, LLP

(57) ABSTRACT

The present invention provides methods of producing trench structures having substantially void-free filler material therein. The fillers may be grown from a liner material such as polysilicon formed along the sidewalls of the trench. Previously formed voids may be healed by exposing the voids and growing epitaxial silicon.

32 Claims, 5 Drawing Sheets

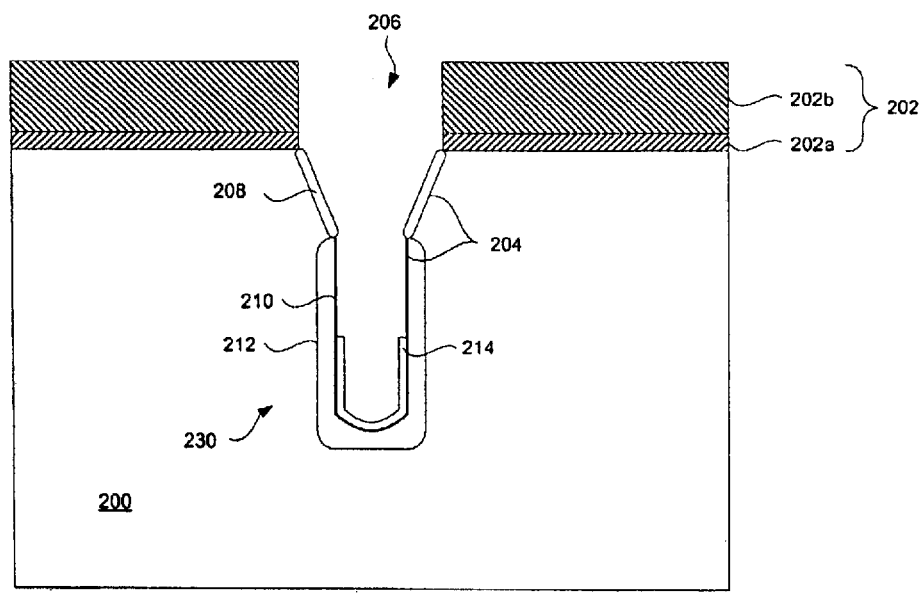
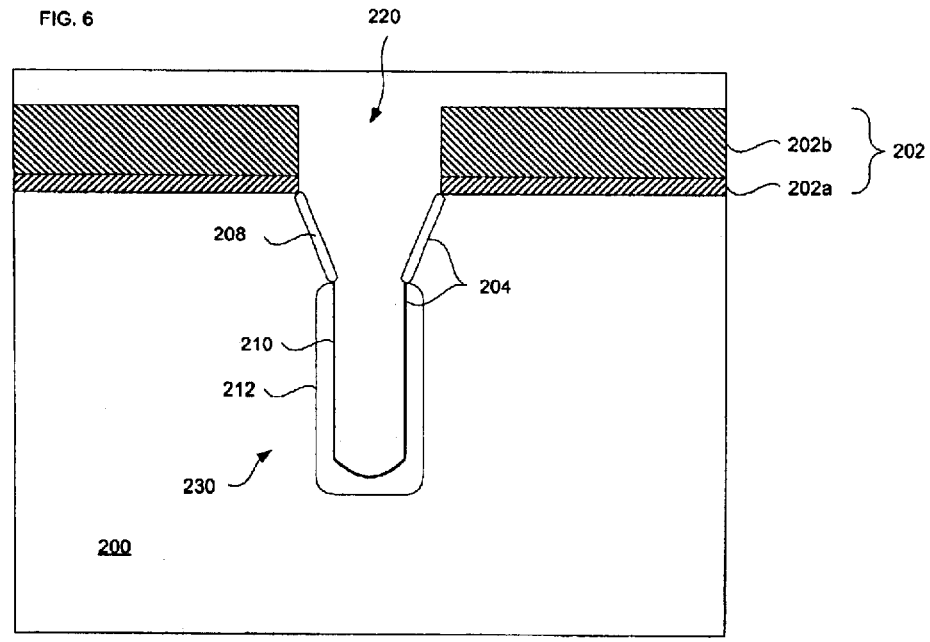

METHOD TO FILL DEEP TRENCH STRUCTURES WITH VOID-FREE POLYSILICON OR SILICON

BACKGROUND OF THE INVENTION

The present invention relates to semiconductor devices, and, more particularly, to semiconductor trench structures having fill material of, e.g., silicon or polycrystalline silicon.

Semiconductor devices are employed in various systems for a wide variety of applications. Device fabrication typically involves a series of process steps including layering materials on a semiconductor substrate wafer, patterning and etching one or more of the material layers, doping selected layers and cleaning the wafer.

Semiconductor manufacturers continually seek new ways to improve performance, decrease cost and increase capacity of semiconductor devices. Capacity and cost improvements may be achieved by shrinking device size. For example, in the case of a dynamic random access memory ("DRAM") chip, more memory cells can fit onto the chip by reducing the size of memory cell components such as capacitors and transistors. The size reduction results in greater memory capacity for the chip. Cost reduction is achieved through economies of scale. Unfortunately, performance can suffer when device components are shrunk. Therefore, it is a challenge to balance performance with other manufacturing constraints.

One method of shrinking device size is to vertically construct the components, either in a stack over the semiconductor substrate or within the substrate itself. One way to accomplish such vertical construction within the substrate involves forming a trench in the substrate. By way of example only, a capacitor may be fabricated within a trench. Such a capacitor is known as a "trench capacitor."

The capacitor stores charge and includes a pair of electrodes separated by a dielectric material. The charge can represent a data value for use in a memory cell, such as a DRAM cell. While it is desirable to shrink the surface area of a trench capacitor to increase memory cell density, the trench capacitor must be able to store a sufficient amount of charge. For example, regardless of size, a trench capacitor of a DRAM cell requires a charge on the order of 25–30 fF (femto Farads). Therefore, it is imperative that trench capacitors be able to store sufficient charge. This may be accomplished by creating trenches which extend relatively deep into the substrate.

A conventional trench capacitor is typically formed as follows. First, a trench is etched in the substrate. The trench has sidewalls defined by surrounding portions of the substrate. Then, an outer electrode, a "buried plate," is formed by implanting a dopant in the substrate surrounding the trench. Next, a dielectric liner, the "node dielectric," is formed along the sidewalls, covering the outer electrode. Subsequently, an inner electrode is deposited within the trench. The inner electrode typically consists of polycrystalline silicon, also known as "polysilicon" or "poly-Si."

In conventional processing, the trench is formed relatively deep within the substrate. For example, a "deep trench" may extend between 4–8 μm below the substrate surface at a given stage in the fabrication process. Deep trenches are typically high aspect ratio trenches. The "aspect ratio" is the ratio of the depth of a trench compared to the width of the opening at the top of the trench. By way of example only, high aspect ratio trenches in advanced semiconductor manufacturing may have an aspect ratio of between 20:1 and 60:1 or higher.

A high aspect ratio trench adversely impacts formation of the inner electrode. This is so because of how the inner electrode is formed. The poly-Si inner electrode is formed by a deposition process such as chemical vapor deposition ("CVD"). For example, an ultra high vacuum ("UHV") CVD process may be used, wherein the pressure is below $1 \times 10^{-7}$ Torr. During deposition, the poly-Si grows inward from the sidewalls. However, this process typically creates voids, gaps or seams within a central portion of the inner electrode.

FIG. 9 illustrates a conventional trench capacitor 430 having a void 422. A trench 406 has been formed into the substrate 400. A pad stack 402 comprised of a pad oxide 402a and a pad nitride 402b covers the surface of the substrate 400. The sidewalls 404 of the trench 406 extend through the pad stack 402 into the substrate 400. A lower portion of the sidewalls 404 are covered with a node dielectric 410, and an upper portion of the sidewalls 404 are covered by an oxide collar 408. An outer dielectric 412 is formed within the substrate 400 adjacent to the node dielectric 410. An inner electrode 420 of poly-Si is formed within the trench 406. As described above, conventional deposition of the poly-Si typically produces the void 422 (or gap or seam) within the inner electrode 420. The void 422 increases the resistance of the trench capacitor 430, which can adversely affect its performance. Furthermore, the void 422 typically increases the difficulty of later processing of the conventional trench capacitor 430. For example, the poly-Si within the trench 406 may be recessed or etched back to a desired depth below the surface of the substrate 400. The void 422 may render this recessing step unpredictable in terms of, e.g., etch rate, depth and width. If the void 422 is within the etch range during poly-Si recessing or etch-back, e.g., approximately 1.3–1.5 μm below the pad oxide 402a and substrate 400 interface, then the recessing or etch-back depth may become uncontrollable. In such a case, the etching/recessing could leave a prominent "V" shape at the bottom of the recessed trench. Then, when the collar 408 is deposited, it could be deposited in the void. Subsequent processing would not remove oxide that remains in the void, which leads to increased contact resistance between the layers of poly-Si deposited to form the inner electrode 420. Furthermore, the presence of the void 422 may create a non-planar surface for the inner electrode 420, thereby affecting later fabrication steps.

Creating a trench having a tapered top can reduce void formation, because the tapered top allows the deposition process better access to the trench, resulting in more complete fill. Generally, increasing the taper angle, e.g., widening the trench opening, reduces void formation. However, larger taper adversely affects the "effective" trench depth (i.e., the depth of the trench excluding the tapered portion).

A void is revealed by etching through the poly-Si until the void is exposed. The void is typically healed by depositing poly-Si into the void after the collar oxide is formed. However, large voids often cause problems such as poor depth control of the healing deposition process. As such, the deposition of poly-Si within long voids running substantially the depth of the trench may not sufficiently heal the defect.

Thus, new methods of formation of capacitor inner electrodes, as well as formation of other fill materials, are desired. The methods should minimize or eliminate void formation in filled trench structures. Improved methods of healing pre-existing voids are also desired.

SUMMARY OF THE INVENTION

The present invention provides methods of forming substantially void-free fillers in trench structures. It is to be appreciated that the numbers used (by way of example only, temperature, time and pressure) are approximations and may be varied, and certain steps may be performed in different order.

In accordance with one embodiment of the present invention, a method of fabricating a semiconductor device is provided. The method comprises first forming a trench having sidewalls in a semiconductor substrate. Next, a liner is deposited over the sidewalls. Then, a filler is grown within the trench from the liner. Preferably, the liner is polysilicon. Also, the filler may be grown in a non-selective manner. Optionally, the method may include removing a native oxide from an exposed surface of the liner prior to growing the filler.

In accordance with another embodiment of the present invention, a method of fabricating a semiconductor device is provided. The method comprises first forming a trench having sidewalls in a semiconductor substrate, and then depositing a first liner over the sidewalls. Next, a second liner is deposited over the first liner. Then, a mask is formed within the trench, and the mask covers a segment of the second liner. Next, portions of the second liner which are not covered by the mask are etched. Then the mask is removed. After removing the mask, portions of the first liner which are not covered by the second liner are then etched. Then remaining portions of the second liner are etched and then a filler is grown within the trench from the first liner that remains. Preferably, the second liner is an oxide, and more preferably is between 5 to 15 nm thick. The method may also include doping the filler by means of in situ doping. This may be performed during the growing step. The step of forming the mask preferably includes first depositing the mask within the trench and then recessing the mask to a desired depth within the trench.

In accordance with yet another embodiment of the present invention, a method of fabricating a semiconductor device is provided. The method comprises first providing a fill material within a trench, wherein the trench has sidewalls formed in a semiconductor substrate. Next, a void within the fill material is exposed. Then, a healing material is grown from the fill material, and the healing material substantially fills the void. Preferably, the healing material is selectively grown from the fill material. More preferably, the healing material is epitaxial silicon.

In accordance with another embodiment of the present invention, a method of fabricating a capacitor is provided. The method comprises first forming a trench having sidewalls in a semiconductor substrate, and forming a buried plate in the semiconductor substrate adjacent to a lower portion of the trench. Next, a dielectric liner is applied along the sidewalls in the lower portion of the trench. Then, a collar is formed along the sidewalls in an upper portion of the trench. A liner is then formed over the sidewalls. Finally, an inner electrode is grown within the trench from the liner. The method preferably also includes a masking process. The masking process comprises the steps of forming a first mask over the liner, depositing a second mask within the trench, wherein the second mask covers a segment of the first mask, removing portions of the first mask which are not covered by the second mask, and removing the second mask, then removing portions of the liner not covered by the first mask, and removing remaining portions of the first mask.

BRIEF DESCRIPTION OF THE DRAWINGS

FIG. 5 is a schematic cross-sectional view illustrating a further step in the alternative process of forming a substantially void-free trench fill material.

FIG. 6 is a schematic cross-sectional view illustrating an additional step in the alternative process of forming a substantially void-free trench fill material.

The foregoing aspects, features and advantages of the present invention will be further appreciated when considered with reference to the following description of the preferred embodiments and accompanying drawings.

DETAILED DESCRIPTION

In accordance with an embodiment of the present invention, a method of producing substantially void-free trench filler is provided. The method includes forming an initial liner within a trench and then growing additional material from the initial liner. The materials and processes described below can be employed in this and other embodiments with various kinds of substrates, including, but not limited to silicon (Si), gallium arsenide (GaAs), indium phosphide (InP) and silicon carbide (SiC). It is to be appreciated that the process parameters, for example, temperature, pressure and time, are approximations and may be varied, and that certain process steps may be performed in a different order.

Figure 1:
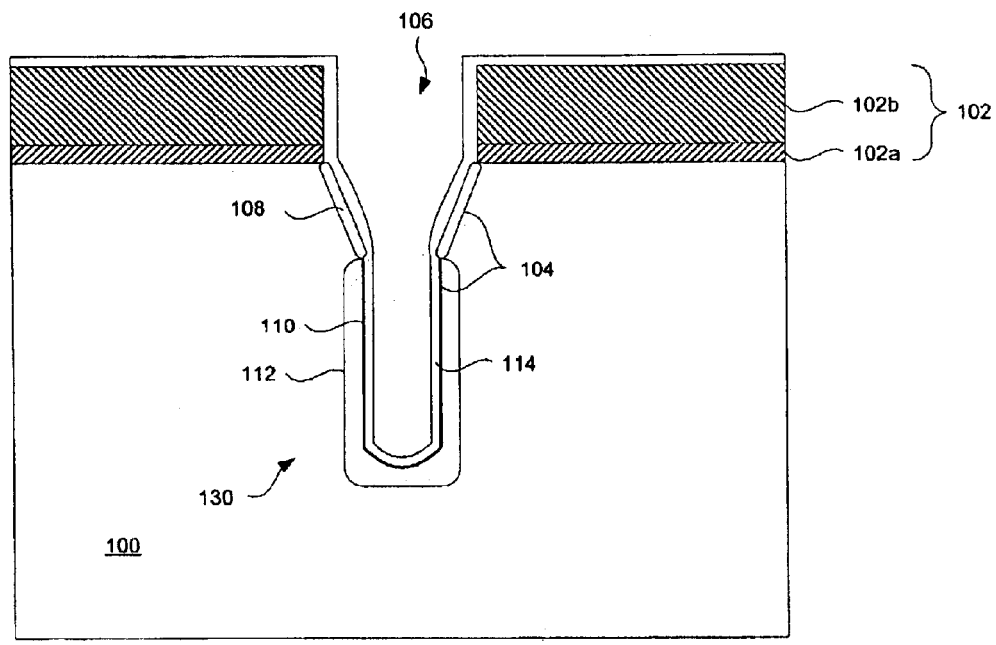
FIG. 1 is a schematic cross-sectional view illustrating a step in a present process of forming a substantially void-free trench fill material.

FIG. 1 illustrates a cross-sectional view of a step in a present process of fabricating a trench capacitor 130, wherein a liner 114 is formed within a trench 106. In prior steps, substrate 100 may be processed as follows. First, a pad stack 102 may be formed on top of the substrate 100. The pad stack 102 may comprise one or more material layers. Preferably, the pad stack includes a pad oxide 102a and a pad nitride 102b that are deposited over the substrate 100. A layer of borosilicate glass (BSG) or tetra-ethyl ortho silicate (TEOS) may be formed over the pad oxide 102a and the pad nitride 102b.

Then the trench 106 is etched in the substrate 100. The etching may be performed by, e.g., reactive ion etching ("RIE") or an equivalent process, as is known in the art. After the trench 106 is etched, the BSG layer, if any, may be removed. Trench sidewalls 104 extend through the pad stack 102 into the substrate 100. The trench 106 is preferably a high aspect ratio trench. As shown in FIG. 1, the trench 106 is a vertical trench having a tapered top. However, any suitable trench shape may be employed. By way of example only, the lower portion of the trench 106 may have a bottle shape, and the upper portion may or may not be tapered.

A buried plate 112 is preferably formed by implanting a dopant into the portion of the substrate 100 surrounding the sidewalls 104 in the lower portion of the trench. A node dielectric 110 is then formed along the sidewalls 104 in the lower portion of the trench. The node dielectric 110 may be selected from a variety of dielectric materials, although the node dielectric 110 preferably has a dielectric constant of at least 3.9, the dielectric constant of silicon dioxide. A collar 108 is preferably formed along the sidewalls in the upper portion of the trench. The collar 108 may comprise an oxide.

After the buried plate 112, the node dielectric 110 and the collar 108 have been formed, the liner 114 is formed along the sidewalls 104, preferably covering the node dielectric 110 and the collar 108. The liner 114 preferably comprises silicon or poly-Si, although other suitable fill materials may be used. The liner 114 is preferably deposited using a CVD process. In one example, the CVD process is performed at a temperature between 560° C. to 650° C. and a pressure of between 10 to 50 mTorr. Most preferably, the temperature is 580° C. and the pressure is 15 mTorr. When the liner 114 is poly-Si, silane gas may be flowed at a rate of 15–50 sccm. More preferably, the rate is 15 sccm. The growth rate is approximately 8 Å per minute. The liner 114 is preferably between 5–15 nm thick.

After formation of the liner 114, an undesired native oxide may be naturally formed over its surface when exposed to ambient air. The native oxide may be removed using buffered hydrofluoric acid (BHF) or dilute hydrofluoric acid (DHF) as is known in the art. An ozone treatment may be employed to remove any residues remaining on the sidewalls 104. The ozone treatment may be performed prior to BHF or DHF etching. One example of an ozone treatment employs 10 ppm of ozone dissolved in DI water.

Figure 2:
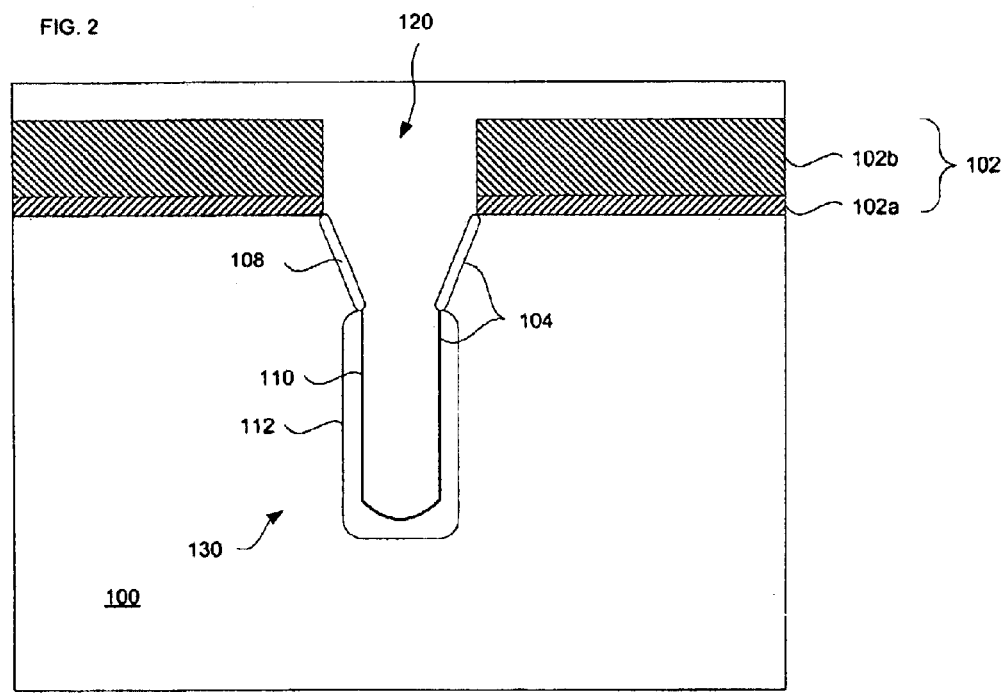
FIG. 2 is a schematic cross-sectional view illustrating a subsequent step in a present process of forming a substantially void-free trench fill material.

As shown by FIG. 2, an inner electrode 120 filler is then grown from the liner 114. The inner electrode 120 preferably comprises the same material as the liner 114. The crystalline structure of the inner electrode 120 may differ from that of the liner 114. Preferably, the inner electrode 120 is grown using a rapid thermal CVD ("RTCVD") process. RTCVD is a conventional CVD process performed at a high temperature to achieve rapid growth. In an example, the temperature is preferably about 710° C., the pressure is about 15 mTorr and silane is flowed at about 400 sccm. The resultant growth rate is on the order of 27 Å/second. The growth process preferably occurs in a non-selective manner, meaning that the growth of poly-Si occurs wherever the liner 114 is located. The inner electrode 120 is thus formed while substantially or entirely eliminating voids therein. Optionally, a dopant may be added during the growth process to in situ dope the inner electrode 120.

After the inner electrode 120 has been formed, it may be planarized and/or etched back or otherwise recessed within the trench 106 to a desired depth, e.g., to a point above or below the collar 108. Then the fabrication process may continue in a conventional manner by, for example, forming an access transistor within the trench 106 over the trench capacitor 130.

Figure 3:
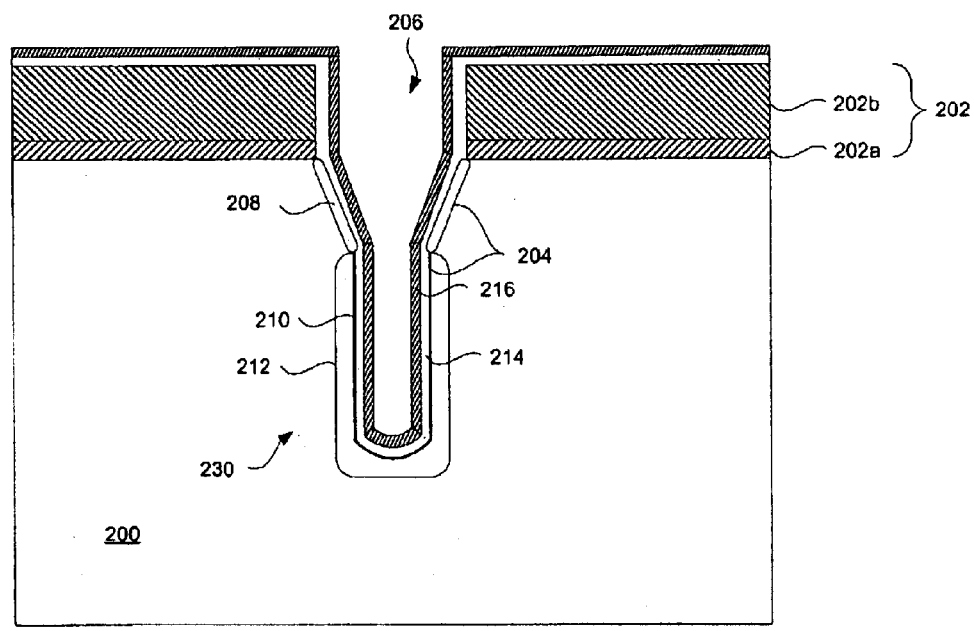
FIG. 3 is a schematic cross-sectional view illustrating a step in an alternative process of forming a substantially void-free trench fill material.

In accordance with another embodiment of the present invention, an alternative method of producing substantially void-free trench filler is provided. FIG. 3 illustrates a cross-sectional view of a substrate 200 at a step in a present process of fabricating a trench capacitor 230. As in the embodiment described above with respect to FIGS. 1 and 2, a trench 206 may been formed within the substrate 200 by RIE or an equivalent process. The trench has sidewalls 204 which extend through a pad stack 202 into the substrate 200. The pad stack 202 may comprise a pad oxide 202a and a pad nitride 202b. At this step in the fabrication process, the trench capacitor 230 includes a buried plate 212, a node dielectric 210 and a collar 208.

As shown in FIG. 3, a liner 214 of, e.g., poly-Si or silicon is formed within the trench 206. The liner 214 is preferably formed as described above with regard to FIG. 1. Then a second liner 216 is preferably formed over the liner 214 by, e.g., deposition. The second liner 216 is preferably a thin oxide layer on the order of 5 to 15 nm. The thin oxide layer may be formed, e.g., by CVD or a thermal process. Alternatively, a material such as a nitride formed by a thermal process may be employed. The second liner 216 will be used as a mask in subsequent processing.

Figure 4:
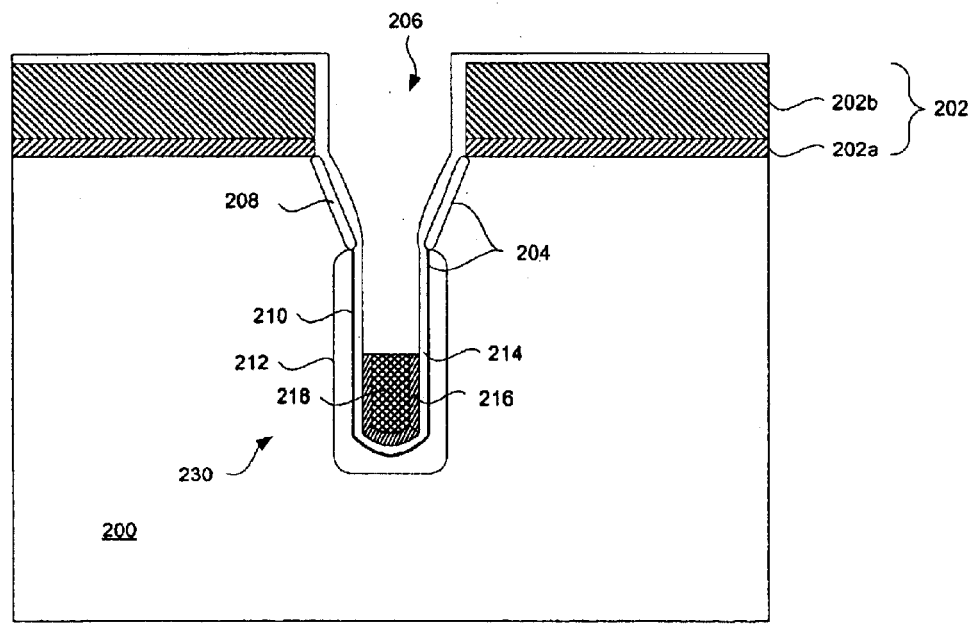
FIG. 4 is a schematic cross-sectional view illustrating a subsequent step in the alternative process of forming a substantially void-free trench fill material.

FIG. 4 illustrates a subsequent step after a portion of the second liner 216 has been removed. Prior to this step, a layer of photoresist 218 has been applied over the second liner 216. The photoresist 218 may be, e.g., a mid UV ("MUV") resist, and is used as a mask, as is known in the art. The photoresist may be planarized to provide a uniform surface. The photoresist is preferably recessed to a desired depth in the trench 206, as shown in FIG. 4. To ensure substantially void-free poly-Si fill, the desired depth is preferably recessed more than the recess depth for the poly-Si within the trench. Then any of the second liner 216 not covered by the photoresist 218 is preferably entirely removed by, e.g., etching. The etching process is preferably a wet etch process. If the second liner 216 is an oxide, BHF is a preferred etchant. If the second liner 216 is a nitride, hot phosphoric acid is a preferred etchant.

Next, the photoresist 218 is removed. Then portions of the liner 214 not covered by the second liner 216 are preferably removed by etching. This etching step is preferably performed isotropically, by, for example BHF. The result is shown in FIG. 5.

Then, as shown in FIG. 6, an inner electrode 220 is grown from the liner 214. A selective epitaxial silicon growth process is preferably used. The inner electrode 220 may be doped in situ during formation. Because the inner electrode 220 is grown from the etched liner 214, it is possible to eliminate the need to subsequently planarize the inner electrode 220 using, e.g., chemical mechanical planarization ("CMP"). It is also possible to eliminate recessing of the inner electrode 220 after its formation. Then the fabrication process may continue in a conventional manner.

Figure 7:
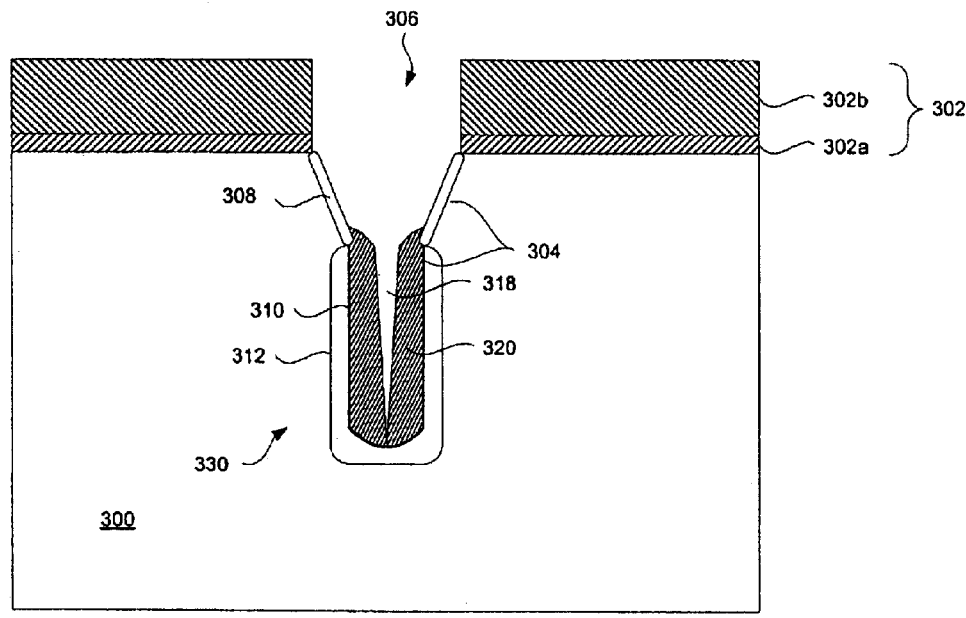
FIG. 7 is a schematic cross-sectional view illustrating a step in a present process of healing a void in a trench fill material.

In accordance with yet another embodiment of the present invention, unwanted voids in preexisting trench structures may be healed by selective growth of a filler material such as epitaxial silicon. FIG. 7 illustrates a cross-sectional view of a step in a present process of healing a trench capacitor 330 having a void 318 therein. At this stage of fabrication, the trench 306 has been formed. The trench 306 has sidewalls 304 which extend through a pad stack 302 into the substrate 300. The pad stack 302 may comprise a pad oxide 302a and a pad nitride 302b. At this step in the fabrication process, the trench capacitor 330 includes a buried plate 312, a node dielectric 310 and a collar 308.

As illustrated in FIG. 7, the void 318 within an inner electrode 320 has been exposed during, for example a poly-Si recess process. The inner electrode 320 is preferably poly-Si. The collar 308 is not materially affected by the processing of the present embodiment.

Figure 8:
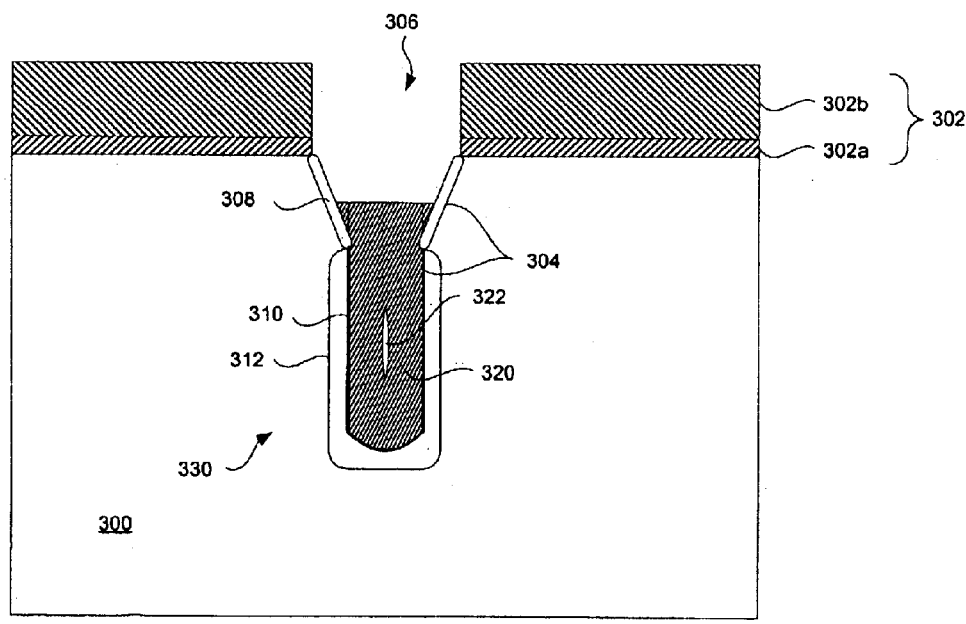
FIG. 8 is a schematic cross-sectional view illustrating a subsequent step in the process of healing a void.
Figure 9:
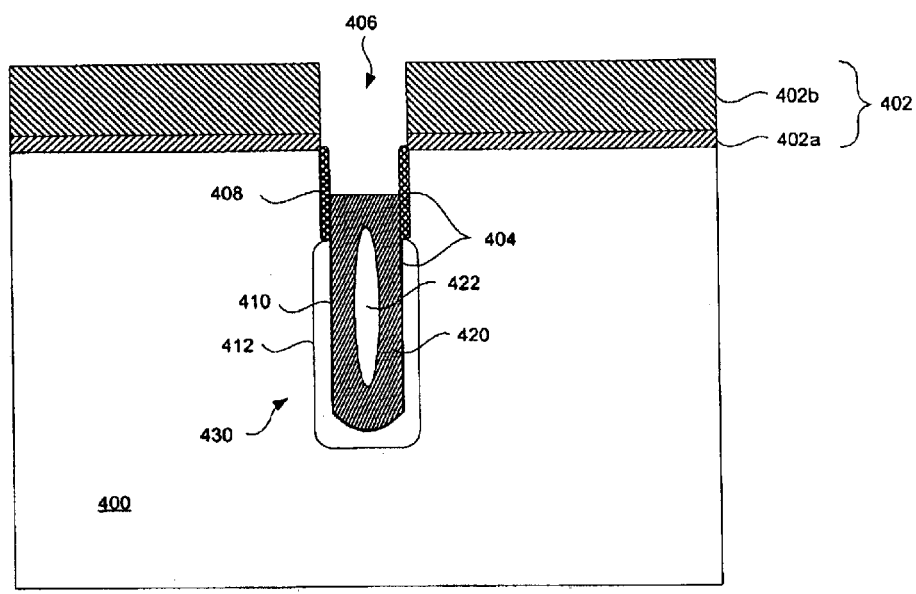
FIG. 9 is a schematic cross-sectional view illustrating a conventional trench capacitor having a void within the inner electrode.

Next, epitaxial silicon is grown on the inner electrode 320 to substantially or completely fill the void/seam. The epitaxial silicon is preferably selectively grown by a two-step process. First, a UHV in situ desorption process is preferably performed at a temperature of about 750° C. and a pressure of about $4 \times 10^{-8}$ Torr for approximately 15 minutes to remove any native oxide present on exposed surfaces. Then, epitaxial silicon is selectively grown on silicon or poly-Si (but not oxide or nitride) at a temperature of about 650° C. and a pressure of about 120 mTorr. The silane may be flowed, e.g., at a rate of 16 sccm and HCl may be flowed, e.g., at a rate of 12 sccm. This produces a growth rate on the order 5.8 Å/min. As shown in FIG. 8, a small void 322 may remain in the healed inner electrode 320.

The epitaxial silicon may be grown to fill the void and then form a substantially flat surface for the inner electrode 320. Alternatively, the selective growth may be continued to substantially or completely till the trench 306. In that situation, the inner electrode 320 may be recessed to a desired depth by, e.g., etching. Because the void/seam is completely eliminated or minimized with the healing growth, the recessing preferably results in a substantially planar upper surface for the inner electrode 320. After the void has been healed, further processing may be performed on the trench capacitor 330.

One advantage of the present invention is that substantially void-free fillers may be formed within a semiconductor trench by first applying a liner along the sidewalls of the trench. These substantially void free fillers may be doped in situ. Another advantage of the present invention is that such fillers may be selectively grown to eliminate costly processing steps such as CMP and recessing. Yet another advantage of the present invention is that preexisting voids or other defects may be healed by selectively growing epitaxial silicon, thereby avoiding additional deposition steps as employed in prior solutions. A further advantage of the present invention is that capacitors can be fabricated without increased resistance due to voids formed therein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of fabricating a semiconductor device, comprising:
    forming a trench having sidewalls in a semiconductor substrate;
    depositing a liner over the sidewalls; and
    growing a filler within the trench from the liner.
2. The method of claim 1, wherein the liner is polysilicon.
3. The method of claim 2, wherein the filler is grown in a non-selective manner.
4. The method of claim 1, wherein the liner is silicon.
5. The method of claim 1, wherein the liner is between 5–15 nm thick.
6. The method of claim 1, wherein the liner is deposited using CVD.
7. The method of claim 6, wherein the CVD process is performed at a temperature between 560° C. to 650° C. and a pressure between 10 to 50 mTorr.
8. The method of claim 1, further comprising removing a native oxide from an exposed surface of the liner prior to the growing step.
9. The method of claim 8, wherein removing the native oxide is performed using buffered hydrofluoric acid.
10. The method of claim 9, further comprising performing an ozone treatment to remove byproducts formed with the buffered hydrofluoric acid.
11. The method of claim 1, wherein growing the filler is performed by RTCVD.
12. The method of claim 11, wherein the RTCVD is performed at a temperature of about 710° C. and a pressure of about 15 mTorr.
13. The method of claim 1, further comprising, prior to growing the filler, the steps of:
    forming a first mask over the liner;
    depositing a second mask within the trench, the second mask covering a segment of the first mask;
    removing portions of the first mask not covered by second mask;
    removing the second mask;
    removing portions of the liner not covered by the first mask; and
    removing remaining portions of the first mask.
14. The method of claim 1, further comprising in situ doping the filler during the growing step.
15. The method of claim 1, wherein the trench is a high aspect ratio trench.
16. A method of fabricating a semiconductor device, comprising:
    forming a trench having sidewalls in a semiconductor substrate;
    depositing a first liner over the sidewalls;
    depositing a second liner over the first liner;
    forming a mask within the trench, the mask covering a segment of the second liner;
    etching portions of the second liner not covered by mask;
    removing the mask;
    etching portions of the first liner not covered by the second liner;
    etching remaining portions of the second liner; and
    growing a filler within the trench from the first liner.
17. The method of claim 16, wherein the second liner is an oxide.
18. The method of claim 16, wherein the second liner is about 5 to 15 nm thick.
19. The method of claim 16, further comprising in situ doping the filler during the growing step.
20. The method of claim 16, wherein the step of forming the mask includes:
    depositing the mask within the trench; and
    recessing the mask to a desired depth within the trench.
21. The method of claim 16, wherein the step of etching the portions of the first liner is performed by isotropic etching.
22. The method of claim 16, wherein etching the remaining portions of the second liner is performed using buffered hydrofluoric acid.
23. A method of fabricating a semiconductor device, comprising:
    providing a fill material within a trench, the trench having sidewalls in a semiconductor substrate;
    exposing a void within the fill material; and
    growing a healing material from the fill material to substantially fill the void.
24. The method of claim 23, wherein the healing material is selectively grown from the fill material.
25. The method of claim 23, wherein the healing material is epitaxial silicon.
26. The method of claim 23, wherein the healing material is grown at a temperature of about 650° C. and a pressure of about 120 mTorr.

27. The method of claim 23, wherein the healing material is grown to provide a substantially planar surface for the fill material.

28. The method of claim 23, wherein the growing step includes substantially fill the trench with the healing material.

29. The method of claim 28, further comprising recessing the healing material to a desired depth within the trench.

30. A method of fabricating a capacitor, comprising:
   forming a trench having sidewalls in a semiconductor substrate;
   forming a buried plate in the semiconductor substrate adjacent to a lower portion of the trench;
   applying a dielectric liner along the sidewalls in the lower portion of the trench;
   forming a collar along the sidewalls in an upper portion of the trench;
   forming a liner over the sidewalls; and
   growing an inner electrode within the trench from the liner.

31. The method of claim 30, further comprising, prior to growing the inner electrode, the steps of:
   forming a first mask over the liner;
   depositing a second mask within the trench, the second mask covering a segment of the first mask;
   removing portions of the first mask not covered by second mask;
   removing the second mask;
   removing portions of the liner not covered by the first mask; and
   removing remaining portions of the first mask.

32. The method of claim 30, further comprising electrically connecting a transistor to the inner electrode.

* * * * *